United States Patent
Hu et al.

(10) Patent No.: US 10,468,455 B2
(45) Date of Patent: Nov. 5, 2019

(54) SIMPLIFIED DOUBLE MAGNETIC TUNNEL JUNCTIONS

(71) Applicants: INTERNATIONAL BUSINESS MACHINES CORPORATION, Armonk, NY (US); SAMSUNG ELECTRONICS, CO., LTD., Gyeonggi-Do (KR)

(72) Inventors: Guohan Hu, Yorktown Heights, NY (US); Younghyun Kim, Seoul (KR); Jeong-Heon Park, Seoul (KR); Daniel Worledge, Cortlandt Manor, NY (US)

(73) Assignees: INTERNATIONAL BUSINESS MACHINES CORPORATION, Armonk, NY (US); SAMSUNG ELECTRONICS, CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/096,864

(22) Filed: Apr. 12, 2016

(65) Prior Publication Data
US 2017/0294482 A1    Oct. 12, 2017

(51) Int. Cl.
| | | |
|---|---|---|
| *G11C 11/16* | (2006.01) | |
| *H01L 27/22* | (2006.01) | |
| *H01L 43/02* | (2006.01) | |
| *H01L 43/08* | (2006.01) | |
| *H01L 43/10* | (2006.01) | |
| *H01L 43/12* | (2006.01) | |

(52) U.S. Cl.
CPC .......... *H01L 27/226* (2013.01); *G11C 11/161* (2013.01); *H01L 43/08* (2013.01); *H01L 43/10* (2013.01); *H01L 43/12* (2013.01)

(58) Field of Classification Search
CPC combination set(s) only.
See application file for complete search history.

(56) References Cited

U.S. PATENT DOCUMENTS

| | | | |
|---|---|---|---|
| 6,593,608 B1 | 7/2003 | Sharma et al. | |
| 7,596,015 B2 * | 9/2009 | Kitagawa ............... | B82Y 25/00 365/158 |

(Continued)

FOREIGN PATENT DOCUMENTS

KR    20140113015 A  *  9/2014    ............ H01L 43/02

OTHER PUBLICATIONS

Tudosa, I. et al., "Perpendicular spin-torque switching with a synthetic antiferromagnetic reference layer" Applied Physics Letters (May 2010) pp. 212504-1-212504-3, vol. 96 No. 21.

(Continued)

*Primary Examiner* — Telly D Green
(74) *Attorney, Agent, or Firm* — Tutunjian & Bitetto, P.C.; Vazken Alexanian

(57) ABSTRACT

Double magnetic tunnel junctions and methods of forming the same include a bottom reference layer having a first fixed magnetization and a first thickness. A first tunnel barrier is formed on the bottom reference layer. A free layer is formed on the first tunnel barrier and has a changeable magnetization. A second tunnel barrier is formed on the free layer. A top reference layer is formed on the second tunnel barrier and has a second fixed magnetization that is opposite to the first fixed magnetization and a second thickness that is significantly smaller than the first thickness.

20 Claims, 3 Drawing Sheets

(56) References Cited

U.S. PATENT DOCUMENTS

| | | | |
|---|---|---|---|
| 8,233,249 B2 | 7/2012 | Worledge | |
| 8,686,484 B2* | 4/2014 | Whig | H01L 43/08 257/295 |
| 8,697,484 B2 | 4/2014 | Apalkov et al. | |
| 8,779,538 B2 | 7/2014 | Chen et al. | |
| 8,871,365 B2* | 10/2014 | Wang | G11B 5/66 428/811 |
| 9,087,633 B2 | 7/2015 | Khvalkovskiy et al. | |
| 9,159,906 B2* | 10/2015 | Whig | H01L 43/08 |
| 9,214,625 B2 | 12/2015 | Annunziata et al. | |
| 9,419,208 B2* | 8/2016 | Whig | H01L 43/08 |
| 9,496,488 B2* | 11/2016 | Kwon | H01L 43/08 |
| 9,553,258 B2* | 1/2017 | Whig | H01L 43/08 |
| 9,666,214 B1* | 5/2017 | Bertero | G11B 5/39 |
| 9,825,220 B2* | 11/2017 | Apalkov | H01L 43/08 |
| 2004/0056288 A1* | 3/2004 | Fukuzumi | B82Y 10/00 257/295 |
| 2006/0132990 A1* | 6/2006 | Morise | G11C 11/16 360/324.12 |
| 2008/0088980 A1* | 4/2008 | Kitagawa | B82Y 25/00 360/313 |
| 2009/0213638 A1* | 8/2009 | Morise | G11C 11/16 365/145 |
| 2012/0313191 A1* | 12/2012 | Whig | H01L 43/08 257/421 |
| 2013/0207209 A1* | 8/2013 | Wang | H01L 43/08 257/421 |
| 2013/0224521 A1* | 8/2013 | Wang | G11B 5/66 428/828 |
| 2014/0124881 A1* | 5/2014 | Kwon | H01L 43/08 257/421 |
| 2014/0217528 A1* | 8/2014 | Whig | H01L 43/08 257/421 |
| 2014/0286084 A1* | 9/2014 | Watanabe | G11C 11/161 365/158 |
| 2015/0340600 A1 | 11/2015 | Kim et al. | |
| 2016/0013401 A1* | 1/2016 | Whig | H01L 43/08 257/421 |
| 2016/0163964 A1* | 6/2016 | Whig | H01L 43/08 257/421 |
| 2016/0181511 A1* | 6/2016 | Kwon | H01L 43/08 257/421 |
| 2016/0380182 A1* | 12/2016 | Watanabe | H01L 43/02 257/427 |
| 2017/0141156 A1* | 5/2017 | Apalkov | H01L 43/08 |

OTHER PUBLICATIONS

Apalkov, D. et al., "Spin-transfer torque magnetic random access memory (STT-MRAM,)" ACM Journal on Emerging Technologies in Computing Systems (JETC) (May 2013) pp. 13.1-13.35, vol. 9, No. 2, Article 13.

* cited by examiner

SIMPLIFIED DOUBLE MAGNETIC TUNNEL JUNCTIONS

BACKGROUND

Technical Field

The present invention relates to magnetic tunnel junction devices and, more particularly, to magnetic random access memory cells using double magnetic tunnel junctions.

Description of the Related Art

Magnetoresistive random access memory (MRAM) cells may be formed using magnetic tunnel junction structures. In such a device, a "fixed" magnetic layer is separated from a "free" magnetic layer by a thin insulating barrier. When a voltage is applied across the device, electrons tunnel through the insulating barrier by quantum effects, creating a current. The orientation of the magnetization of the free layer relative to the fixed layer determines how likely an electron is to tunnel across the barrier, such that the magnetization of the free layer determines an effective resistance of the device that can be measured.

The magnetization of the free layer may be set using, e.g., spin-transfer torque. By applying a spin-polarized current to the free magnetic layer, angular momentum is transferred to the free layer and the orientation of its magnetization can be changed. In this manner, a bit of information may be stored in the MRAM cell and subsequently read out by applying a current and determining the resistance.

However, in conventional magnetic tunnel junction devices, where a single tunnel barrier is used, the switching current used to set a state of the device can be quite high. This problem may be addressed by using double magnetic tunnel junction devices, where the free layer is sandwiched between two insulating layers, with fixed layers above and below. In such a device, the spin current from each side of the free layer may add, thereby lowering the switching current needed.

While such a structure effectively lowers the switching current, the thickness of the stack is nearly doubled relative to a single magnetic tunnel junction device. Thick device stacks take longer to grow and etch during fabrication, thereby increasing the cost and decreasing the efficiency of fabrication.

SUMMARY

A double magnetic tunnel junction includes a bottom reference layer having a first fixed magnetization and a first thickness. A first tunnel barrier is on the bottom reference layer. A free layer is on the first tunnel barrier and has a changeable magnetization. A second tunnel barrier is on the free layer. A top reference layer is formed on the second tunnel barrier and has a second fixed magnetization that is opposite to the first fixed magnetization and a second thickness that is significantly smaller than the first thickness.

A memory device includes a plurality of magnetoresistive random access memory (MRAM) cells. Each MRAM cell includes a bottom reference layer having a fixed magnetization and a first thickness. A first tunnel barrier is on the bottom reference layer. A free layer is on the first tunnel barrier and has a changeable magnetization. A second tunnel barrier is on the free layer. A top reference layer has a fixed magnetization and a second thickness that is significantly smaller than the first thickness. The top reference layer includes a first magnetic layer on the second tunnel barrier, a spacer on the first magnetic layer, a second magnetic layer on the spacer, and an oxide cap on the second magnetic layer. A plurality of control transistors, each connected to a respective MRAM cell, is configured to control reading of information from and writing of information to the respective MRAM cell.

A method of forming a double magnetic tunnel junction includes forming a bottom reference layer having a first fixed magnetization and a first thickness. A first tunnel barrier is formed on the bottom reference layer. A free layer is formed on the first tunnel barrier and has a changeable magnetization. A second tunnel barrier is formed on the free layer. A top reference layer is formed on the second tunnel barrier and has a second fixed magnetization that is opposite to the first fixed magnetization and a second thickness that is significantly smaller than the first thickness.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide double magnetic tunnel junction devices that provide lowered switching current relative to a single-barrier design and, furthermore, employ a thin top layer that significantly reduces the overall thickness of the device.

Figure 1:
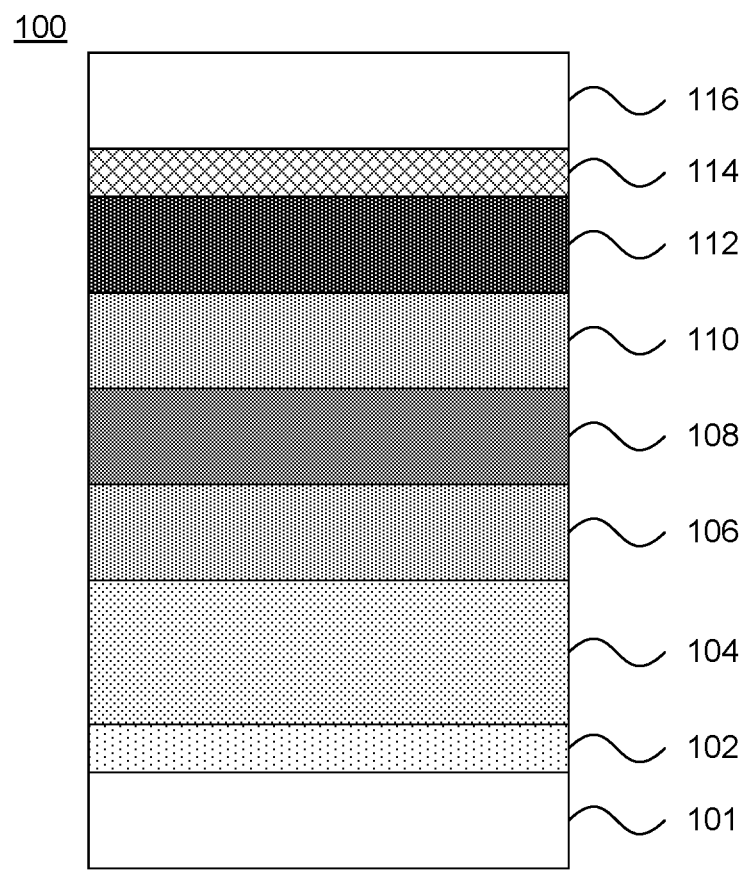
FIG. 1 shows a double magnetic tunnel junction in accordance with the present principles.

Referring now to the drawings in which like numerals represent the same or similar elements and initially to FIG. 1, a diagram of a double magnetic tunnel junction device 100 is shown. The device 100 includes an initial seed layer 102 formed on a bottom electrode 101. A bottom reference layer 104 is grown on the seed layer and may include one or more constituent layers and may have a thickness of about 20 Å to about 120 Å. The bottom reference layer 104 is formed to have a fixed magnetization. It is specifically contemplated that the bottom reference layer 104 may have a synthetic anti-ferromagnetic (SAF) structure that is cobalt-platinum or cobalt-iridium based with ruthenium or iridium spacers.

The bottom reference layer 104 may be a single layer region that is constructed of a metal or metal alloy that includes one or more metals exhibiting high spin polarization. In alternative embodiments, exemplary metals for the formation of the bottom reference layer 104 include iron, nickel, cobalt, chromium, boron, and manganese. Exemplary metal alloys may include the metals exemplified by the above. In another embodiment, the reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

A first barrier layer 106 is formed on the bottom reference layer 104. The barrier is formed from an appropriate insulator material and is formed at such a thickness as to provide an appropriate tunneling resistance. Exemplary materials for the first barrier layer 106 include magnesium oxide, aluminum oxide, and titanium oxide, or materials of higher electrical tunnel conductance, such as semiconductors or low-bandgap insulators. The thickness of the first barrier layer 106 will depend on the material selected. The first barrier layer may have an exemplary thickness of about 5 Å to about 20 Å.

A free layer 108 is formed on the first barrier layer 106. The free layer 108 is formed from a magnetic material with a magnetization that can be changed in orientation relative to the magnetization orientation of the bottom reference layer 104. Exemplary materials for the free layer 108 include alloys and/or multilayers of cobalt, iron, alloys of cobalt-iron, nickel, alloys of nickel-iron, and alloys of cobalt-iron-boron. The free layer 108 may have an exemplary thickness of about 10 Å to about 30 Å.

A second barrier layer 110 is formed on the free layer 108. It is specifically contemplated that the second barrier layer 110 may have the same composition and thickness as the first barrier layer 106, but alternative embodiments may include a second barrier layer 110 that is formed from a different material and at a different thickness.

A top reference layer 112 is formed on the second barrier layer 110. The top reference layer 112 has a fixed magnetization that is oriented opposite to the magnetization of the bottom reference layer 104. It is specifically contemplated that the top reference layer 112 will have multiple constituent layers, as described below, and will have an exemplary thickness of about 20 Å to about 40 Å.

A cap layer 114 is formed on the top reference layer 112. The cap layer 114 may be formed from one or more different kinds of oxides. Exemplary oxide materials for the cap layer 114 include metal oxides such oxides of aluminum, oxides of magnesium, oxides of magnesium and titanium, oxides of magnesium and tantalum, oxides of titanium, oxides of tantalum, oxides of tungsten, oxides of iridium, oxides of zirconium, and oxides of ruthenium, among others. In one embodiment, the cap layer may be formed magnesium oxide and may have thickness of about 2 Å to about 20 Å. A top electrode 116 is formed over the cap layer 114. It is contemplated that the total double magnetic tunnel junction device 100 may have a thickness of about 100 Å to about 150 Å, as compared to a conventional single tunnel junction device which may have a thickness of about 140 Å.

Figure 2:
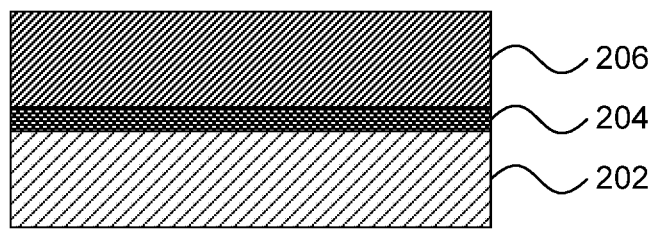
FIG. 2 shows an ultra-thin top reference layer in accordance with the present principles.

Referring now to FIG. 2, a more detailed view of the top reference layer 112 is shown. The top reference layer 112 includes a first magnetic layer 202, a spacer layer 204, and a second magnetic layer 206. The first magnetic layer 202 may be formed from, e.g., cobalt, iron, cobalt-iron, cobalt-iron-boron, or multi-layers thereof. The second magnetic layer 206 may be formed from similar materials to the first magnetic layer 202 or may have a different set of materials.

The spacer layer 204 plays two roles in the top reference layer. First, it generates two more interfaces with interfacial perpendicular magnetic anisotropy. This increases the PMA of the top reference layer as a whole. Secondly, being formed from a heavy element, the spacer layer increases the damping constant of the top reference layer 112, which makes the top reference layer 112 more stable under spin torque during switching.

The spacer layer 204 may be formed from, e.g., a heavy element or alloy of heavy elements to increase damping of the magnetic layers to make their magnetization stable under the application of a spin torque. In one specific embodiment, it is contemplated that the spacer layer may be formed from tungsten. Alternative materials for the spacer layer 204 may include one or more of, e.g., tantalum, molybdenum, iridium, ruthenium, hafnium, platinum, and rhodium.

Optimized top reference layer 112 can be 400° C. stable and show very strong magnetic perpendicular anisotropy. In one example, when a tungsten spacer was used, the top reference layer shows a very high magnetic anisotropy field $H_K$ of greater than about 10 kOe after being annealed at 400° C. for one hour. It is specifically contemplated that the thickness of the top reference layer 112 may be about 20 Å which, in a first embodiment having a cobalt-platinum based bottom SAF reference layer 104, provides a device 100 having a thickness of about 140 Å and a tunnel magnetoresistance (TMR) of about 98%. In a second embodiment, having a cobalt-iridium bottom reference layer 104, the total thickness of the device may be about 100 Å with a TMR of about 110%.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
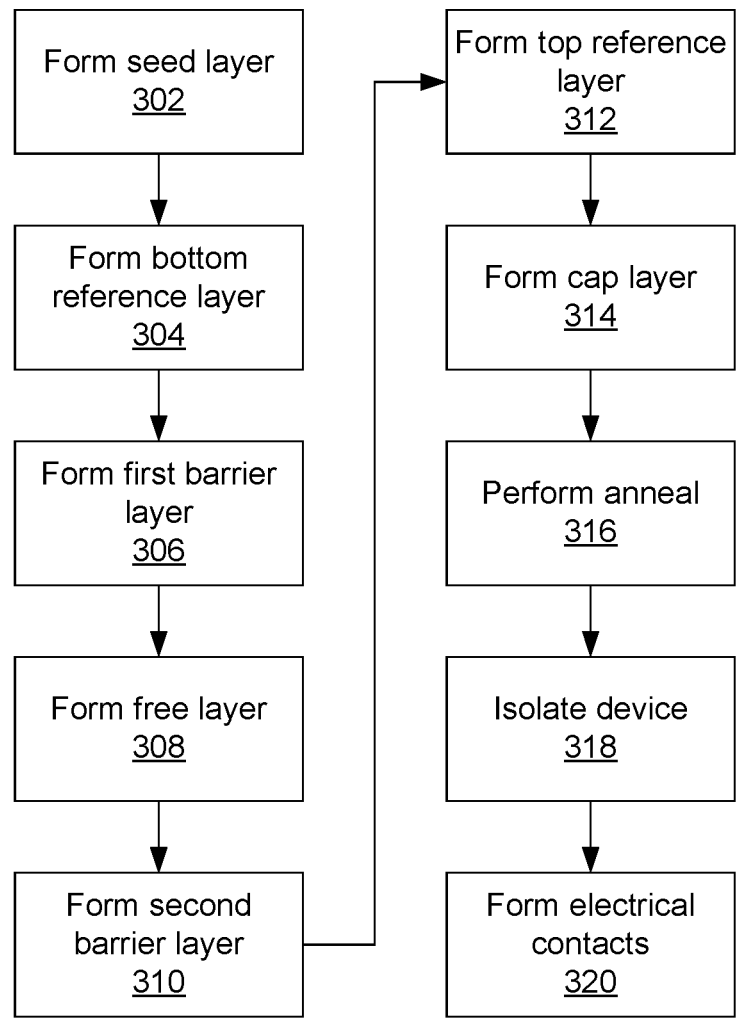
FIG. 3 shows a method of forming a double magnetic tunnel junction in accordance with the present principles.

Referring now to FIG. 3, a method of forming a double magnetic tunnel junction device 100 is shown. Block 302 forms seed layer 102 on the bottom electrode 101. The seed layer 102 may, for example, be formed on a semiconductor substrate or may, alternatively, be a semiconductor substrate itself. A semiconductor substrate may be a bulk-semiconductor substrate. In one example, a bulk-semiconductor substrate may be formed from a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous Si, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. A semiconductor substrate may alternatively be a semiconductor on insulator substrate.

Block 304 forms the bottom reference layer 304. This may include forming a multilayer that includes one or more fixed magnetic layers, separated by spacers. The bottom reference layer may be deposited on the seed layer 302 by any appropriate deposition process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (EPCVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Block 306 forms the first barrier layer 106. As noted above, the first barrier layer may be formed from an appropriate from an appropriate insulator material, such as a metal oxide. Alternatively, the first barrier layer 106 may be formed by metal deposition followed by an oxidation process. Block 308 forms the free layer 308 on the first barrier layer from a material having a changeable magnetization. Block 310 forms the second barrier layer 110 on the free layer 308.

Block 312 forms the top reference layer 112 on the second barrier layer 110. Block 312 first forms the first magnetic layer 202, followed by the spacer layer 204, and then the second magnetic layer 206. Block 314 forms cap layer 114 on the top reference layer 112 from, e.g., an appropriate metal oxide. Block 314 may form the cap layer by any appropriate process including, e.g., CVD, PVD, ALD, or GCIB. Alternatively, block 314 may deposit a layer of metal and then oxidize the same by, e.g., natural oxidation or radical oxidation.

After formation of the device 100, block 316 performs an anneal. The anneal may be performed at a temperature between about 300° C. and about 400° C. for about 5 minutes to about 90 minutes. Block 318 etches the device 100 out of the planar sheet of material that has been formed using any appropriate etch. In an alternative embodiment, etching out the devices 100 may be performed before the anneal of block 316. It is specifically contemplated that an anisotropic etch, such as a reactive ion etch (RIE), may be used to isolate the device 100.

RIE is a form of plasma etching in which during etching the surface to be etched is placed on a powered electrode. During RIE, the surface to be etched takes on a potential that accelerates the etching species extracted from plasma toward the surface, in which the chemical etching reaction is taking place in the direction normal to the surface. Other examples of anisotropic etching that can be used at this point include ion beam etching, plasma etching or laser ablation. Block 320 forms electrical contacts to the device 100. This may include forming top electrode 116 and forming electrical vias and interconnects to the top electrode 116 and the bottom electrode 101.

Figure 4:
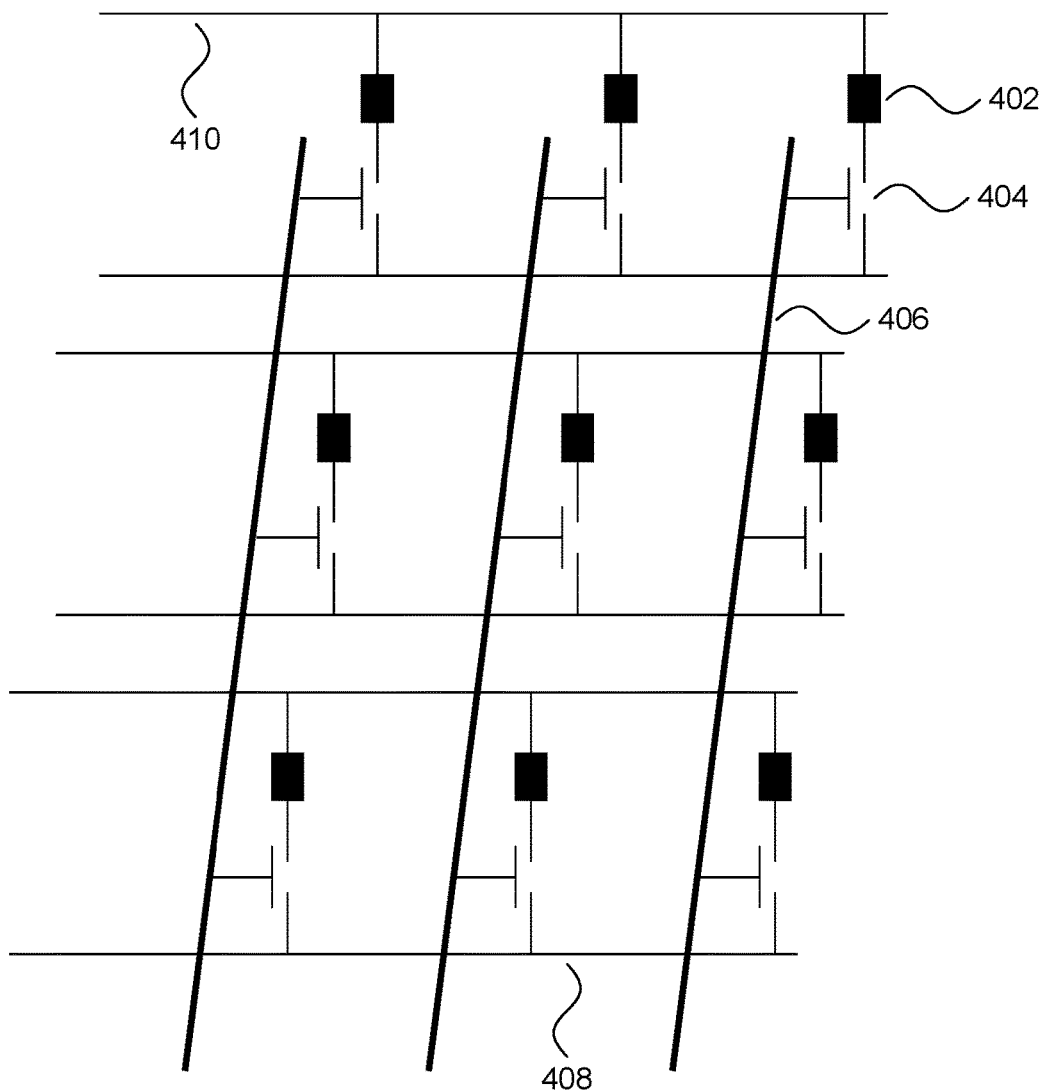
FIG. 4 shows an array of memory devices in accordance with the present principles.

Referring now to FIG. 4, an array of MRAM devices is shown. Each double magnetic tunnel junction 402 is connected to a respective transistor 404 that controls reading and writing. A word line 406 provides data to write to the magnetic tunnel junctions 402, while a bit line 410 and a bit line complement 408 read data from the magnetic tunnel junction 402. In this manner, a large array of memory devices can be implemented on a single chip. An arbitrarily large number of MRAM devices 402 can be employed, within the limits of the manufacturing processes and design specifications.

Writing data to a magnetic tunnel junction 402 includes passing a current through a MTJ. This current causes the direction of magnetization to switch between a parallel or anti-parallel state, which has the effect of switching between low resistance and high resistance. Because this effect can be used to represent the 1s and 0s of digital information, the magnetic tunnel junctions 402 can be used as a non-volatile memory. Passing the current in one direction through the magnetic tunnel junction 402 causes the magnetization of the free layer 108 to be parallel with that of the bottom reference layer 104, while passing the current in the other direction through the magnetic tunnel junction 402 causes the magnetization of the free layer 108 to be antiparallel to that of the bottom reference layer 104. Reading the bit stored in a given magnetic tunnel junction 402 involves applying a voltage (lower than that used for writing information) to the magnetic tunnel junction 402 to discover whether the magnetic tunnel junction offers high resistance to current ("1") or low resistance ("0").

The methods and structures that have been described may be employed in any electrical device. For example, the memory devices that are disclosed herein may be present within electrical devices that employ semiconductors that are present within integrated circuit chips. Integrated circuit chips that include the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

It should be further understood that MRAM devices according to embodiments of the present principles can be employed in any computing apparatus that utilizes random access memory (RAM). For example, such computing apparatuses can utilize the MRAM devices in lieu of or in addition to RAM. Such computing apparatuses can include personal computers, mainframes, laptops, smart phones, tablet computers and other computing devices.

Having described preferred embodiments of simplified double magnetic tunnel junctions (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A double magnetic tunnel junction, comprising:
a bottom reference layer having a first fixed magnetization and a first thickness, and formed from at least one material;
a first tunnel barrier on the bottom reference layer;
a free layer on the first tunnel barrier having a changeable magnetization and having a third thickness;
a second tunnel barrier on the free layer; and
a multilayered top reference layer on the second tunnel barrier having a second fixed magnetization that is opposite to the first fixed magnetization and a second thickness that is smaller than the first thickness, less than about 50 Angstroms, and equal to or greater than the third thickness, and formed from at least one material different from any material of the bottom reference layer.

2. The double magnetic tunnel junction of claim 1, wherein the top reference layer comprises:
a first magnetic layer on the second tunnel barrier;
a spacer on the first magnetic layer; and
a second magnetic layer on the spacer.

3. The double magnetic tunnel junction of claim 2, wherein the first magnetic layer and the second magnetic layer comprise one of cobalt, iron, cobalt-iron, cobalt-iron-boron.

4. The double magnetic tunnel junction of claim 2, wherein the spacer includes a material selected from the group consisting of molybdenum, iridium, hafnium, platinum, and rhodium.

5. The double magnetic tunnel junction of claim 2, wherein the top reference layer further comprises an oxide cap on the second magnetic layer.

6. The double magnetic tunnel junction of claim 1, wherein the second thickness is about 20 Å.

7. The double magnetic tunnel junction of claim 1, wherein the bottom reference layer comprises:
a superlattice formed from one of cobalt-platinum or cobalt-iridium; and
a synthetic anti-ferromagnetic spacer formed from one of ruthenium or iridium.

8. The double magnetic tunnel junction of claim 1, further comprising:
a first electrode formed under the bottom reference layer; and
a second electrode formed on the top reference layer.

9. A memory device, comprising:
a plurality of magnetoresistive random access memory (MRAM) cells, each comprising:
a bottom reference layer having a fixed magnetization and a first thickness between about 21 and about 120 Angstroms, and formed from at least one material to form a synthetic anti-ferromagnetic structure;
a first tunnel barrier on the bottom reference layer including an insulating material that is between 5 and 20 Angstroms thick;
a free layer on the first tunnel barrier having a changeable magnetization and is between 10 and 30 Angstroms thick;
a second tunnel barrier on the free layer; and
a top reference layer having a fixed magnetization and a second thickness of about 20 Angstroms and that is smaller than the first thickness, and formed from at least one material different from any material of the bottom reference layer, comprising:
a first magnetic layer on the second tunnel barrier including cobalt or iron or an alloy thereof;
a spacer on the first magnetic layer including tungsten;
a second magnetic layer on the spacer including cobalt or iron or an alloy thereof; and
an oxide cap on the second magnetic layer having a thickness between 2 and 20 Angstroms; and a plurality of control transistors, each connected to a respective MRAM cell, configured to control reading of information from and writing of information to the respective MRAM cell.

10. The memory device of claim 9, wherein the first magnetic layer and the second magnetic layer of each top reference layer comprise one of cobalt, iron, cobalt-iron, cobalt-iron-boron.

11. The memory device of claim 9, wherein the spacer of the top reference layer includes a material selected from the group consisting of molybdenum, iridium, hafnium, platinum, and rhodium.

12. The memory device of claim 9, wherein the second thickness of each MRAM cell is about 100 Å.

13. The memory device of claim 9, wherein the bottom reference layer of each MRAM cell comprises:
 a superlattice formed from one of cobalt-platinum and cobalt-iridium; and
 a rubidium synthetic anti-ferromagnetic spacer.

14. The memory device of claim 9, wherein each MRAM cell further comprises:
 a first electrode formed under the bottom reference layer; and
 a second electrode formed on the top reference layer, wherein the first and second electrode are connected to the respective control transistor.

15. A method of forming a double magnetic tunnel junction, comprising:
 forming a bottom reference layer having a first fixed magnetization and a first thickness, the bottom reference layer being formed from at least one material;
 forming a first tunnel barrier on the bottom reference layer;
 forming a free layer on the first tunnel barrier having a changeable magnetization and having a third thickness;
 forming a second tunnel barrier on the free layer; and
 forming a multilayered top reference layer on the second tunnel barrier having a second fixed magnetization that is opposite to the first fixed magnetization and a second thickness that is smaller than the first thickness, less than about 50 Angstroms, and about the same as the third thickness, wherein the multilayered top reference layer is formed from at least one material different from any material of the bottom reference layer.

16. The method of claim 15, wherein forming the multilayered top reference layer comprises:
 forming a first magnetic layer on the second tunnel barrier;
 forming a spacer on the first magnetic layer; and
 forming a second magnetic layer on the spacer.

17. The method of claim 16, further comprising forming an oxide cap on the second magnetic layer.

18. The method of claim 15, wherein the second thickness is about 20 Å.

19. The method of claim 15, wherein forming the bottom reference layer comprises forming the bottom reference layer on a bottom electrode.

20. The double magnetic tunnel junction of claim 1, wherein the bottom reference layer includes a thickness of about 80 Å to about 120 Å, and wherein the top multilayered reference layer includes a thickness of about 20 Å.

* * * * *